United States Patent [19]

Holden

[11] 4,379,993
[45] Apr. 12, 1983

[54] PULSE FAILURE MONITOR CIRCUIT EMPLOYING SELECTABLE FREQUENCY REFERENCE CLOCK AND COUNTER PAIR TO VARY TIME PERIOD OF PULSE FAILURE INDICATION

[75] Inventor: James R. Holden, Chicago, Ill.

[73] Assignee: GTE Automatic Electric Labs Inc., Northlake, Ill.

[21] Appl. No.: 220,932

[22] Filed: Dec. 29, 1980

[51] Int. Cl.³ .................... H03K 13/32; H03K 17/296
[52] U.S. Cl. .................................. 328/120; 307/518; 307/608; 328/129.1
[58] Field of Search ................ 307/518, 608; 328/129, 328/120, 119

[56] References Cited
U.S. PATENT DOCUMENTS

| | | | |
|---|---|---|---|
| 3,350,580 | 10/1967 | Harrison | 307/608 X |
| 3,582,795 | 6/1971 | Heick | 307/608 X |
| 3,936,745 | 2/1976 | Harrington | 328/129 X |
| 4,023,109 | 5/1977 | Shreve | 307/518 X |
| 4,052,676 | 10/1977 | Crittenden | 328/129 X |

*Primary Examiner*—John S. Heyman
*Attorney, Agent, or Firm*—Robert J. Black; Gregory G. Hendricks

[57] ABSTRACT

A monitor circuit, for use in a switching system which detects pulse failures through use of a pair of timing counters. A flip-flop enables and clears each counter alternately in response to detection of the monitored pulse.

14 Claims, 1 Drawing Figure

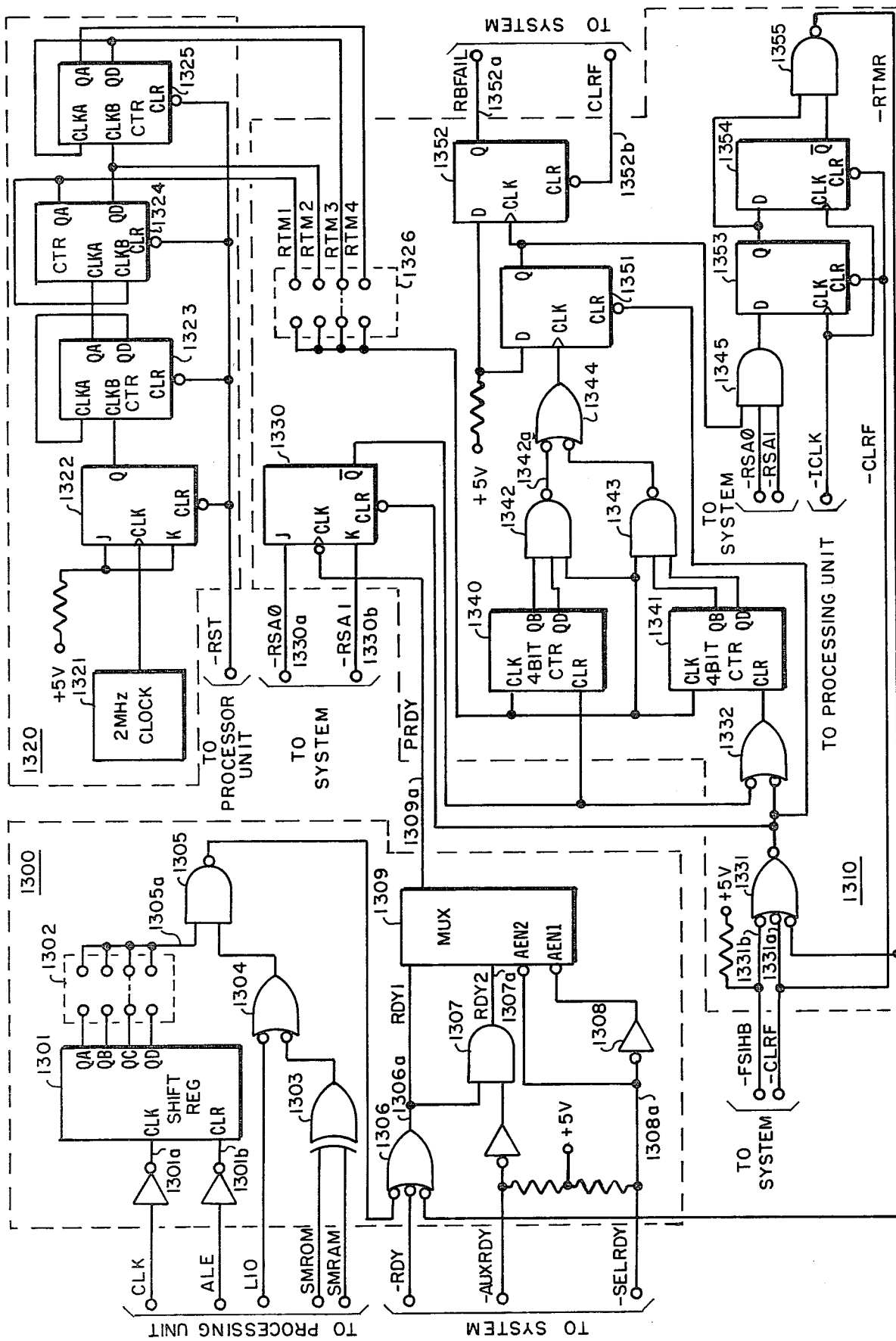

PULSE FAILURE MONITOR CIRCUIT EMPLOYING SELECTABLE FREQUENCY REFERENCE CLOCK AND COUNTER PAIR TO VARY TIME PERIOD OF PULSE FAILURE INDICATION

BACKGROUND OF THE INVENTION (1) Field of the Invention

The present invention relates to switching systems and more particularly to a pulse monitor circuit for use in switching systems.

(2) Description of the Prior Art

Current state-of-the-art pulse monitor circuits use retriggerable monostable multivibrators. These circuits are designed to operate with the time-out period of the multivibrator set to a time slightly longer than the time between consecutive pulses. Therefore, a missing pulse causes the monostable multivibrator to time-out and an alarm is set. However, retriggerable monostable multivibrators have poor timing tolerances and a low degree of repeatability.

Accordingly it is the object of the present invention to provide a highly reliable low tolerance digital pulse monitor.

SUMMARY OF THE INVENTION

The present invention is a circuit which monitors the expected time intervals between monitored pulses. A flip-flop toggles in response to detection of a ready pulse and alternately generates two clear signals. Two counters are connected to the flip-flop and each is cleared in response to an associated clear signal. Both counters are also connected to a reference clock. Each counter counts clock pulses from the reference clock and if a monitored ready pulse doesn't arrive and cause a clear signal to be generated before the counter times-out an alarm is set. Thus a race condition exists with the counters timing out unless a monitored pulse is detected before a predetermined number of reference clock pulses are counted.

A two-bit counter generates a simulated ready signal in response to the alarm signal. This simulated ready signal operates to clear the timing counters to allow them to continue monitoring the ready pulses.

DESCRIPTION OF THE DRAWINGS

The single FIGURE of the accompanying drawing is a logic diagram of a pulse monitor in accordance with the present invention.

DESCRIPTION OF THE PREFERRED EMBODIMENT

Referring now to the accompanying drawing, the ready pulse monitor circuit of the present invention is shown. Shift register 1301 is shown connected to the processing unit via leads 1301a and b. The processing unit generates an address latch enable (ALE) signal at the beginning of every instruction cycle. Since this signal is applied to shift register 1301 via lead 1301b, shift register 1301 is cleared at the beginning every instruction cycle of the processing unit. After being cleared shift register 1301 generates a series of logic 1 signals on its QA, QB and QC and QD outputs in response to successive clock pulses on lead 1301a.

Strapping field 1302 connected to shift register 1301 provides facility for connecting any of the outputs of shift register 1301 to gate 1305. Thus shift register 1301 and strapping field 1302 operated as a wait-state generator, since, by selecting which output is connected to gate 1305, a level 1 signal can be provided immediately after the first, second, third or fourth clock pulse corresponding to outputs QA, QB, QC and QD. Thus wait-states equal to 0, 1, 2 or 3 clock pulses can be provided on lead 1305a.

These wait-states are chosen to provide an amount of time equal to the slowest internal memory or I/O device to be accessed by the processing unit. Thus the processing unit is forced to wait the required time before looking at data provided by the slower memory or I/O devices.

Exclusive OR gate 1303 enables the selected wait signal via gate 1304 when either the read only memory or random access memory but not both is selected. This condition is defined by the select master ROM (SMROM) and select master RAM (SMRAM) signals. Gate 1304 also enables the selected wait signal in response to a local I/O access as defined by the local I/O (LIO) signal. Gate 1305 generates the internal ready (IRD4) signal in response to the ready-only memory, random-access memory or local I/O access and the selected wait signal.

This internal ready signal along with an external ready (−RDY) signal appears at gate 1306 which generates a ready-1 (RDY1) signal on lead 1306a. Multiplex 1309 transfers this RDY1 signal to lead 1309a as a processor ready (PRDY) signal in response to a logic level 0 signal at the auxiliary enable-1 (AEN1) input. A logic level 0 signal normally appears at this input since the inverted select ready (−SELRDY) signal is normally a logic level 1. Similarly multiplex 1309 provides a logic level 1 PRDY signal in response to a logic level 0 auxiliary enable-2 (AEN2) signal and a ready-2 (RDY2) signal on lead 1307a. Gate 1307 generates the RDY2 signal only if a logic level 0 inverted auxiliary ready (−AUXRDY) signal appears on lead 1307b. This AUXRDY signal is used for maintenance purposes as is the SELRDY signal on lead 1308a which is required to enable the RDY2 signal. An example of a typical use for these signals would be where the auxiliary ready signal is connected to an operators panel and the select ready signal is connected to an instruction step button.

Ready circuit 1300 is shown connected to ready monitor circuit 1310 via the processor ready (PRDY) signal on lead 1309a. Two MHz reference clock circuit 1320 is shown connected to divide by 10 counters 1350 and 1341 via strapping field 1326. Two MHz clock source 1321 is shown connected to flip-flop 1322 whose J and K inputs are tied to a logic level 1 or +5 volt power supply. Thus flip-flop 1322 operates as a toggle flip-flop and divides the 2 MHz clock frequency down to a 1 MHz signal.

Biquinary counters 1323, 1324 and 1325 operate to divide their clock A signal by 2 and their clock B signal by 5. These divided signals appear at the QA and QD outputs respectively. Thus biquinary counter 1323 divides the 1 MHz signal appearing at its clock B input by 5 thereby generating a 200 KHz signal on its QD output. This QD output signal appears at the clock A input and biquinary counter 1323 divides this frequency by 2 and applies it to its QA output. Therefore the signal appearing at the QA output of biquinary counter 1323 has a 100 KHz signal. This signal appears at the clock A input of biquinary counter 1324 which divides it by 2 and thus provides a 50 KHz signal at its QA output. Since this signal appears at the clock B input of biquinary counter 1324, it divides this signal by 5 thereby generating a 10 KHz signal at its QD output. Since this signal appears at the clock B input of biquinary counter 1325 it divides this signal by 5 and generates a 2 KHz signal at its QD output. Since this signal also appears at the clock A input of this counter it divides that signal by 2 thereby generating a 1 KHz signal at its QA output.

Thus 4 different frequencies appear at strapping field 1326, namely a 50 KHz signal, a 10 KHz signal, a 2 KHz signal and a 1 KHz signal. These signals have periods of 0.02 millisecond, 0.1 millisecond, 0.5 milliseconds and 1 millisecond respectively. Through use of straps in strapping field 1326 any of these four frequencies can be used as a reference frequency for monitor 1310. Typically the period to be selected would be slightly longer than the slowest ready signal to be monitored thereby allowing a properly operating ready signal to reset the monitor before it times out under control of the reference frequency.

Assuming flip-flop 1330 is initially reset, a logic level 1 signal appears on its $\overline{Q}$ output. This logic level 1 signal clears 4-bit counter 1340. However it has no effect on 4-bit counter 1341 since gate 1332 requires logic level 0 inputs to generate a logic level 1 clear signal. Therefore counter 1340 is prevented from counting while counter 1341 is free to count.

Counter 1340 counts the number of clock pulses appearing at its clock input from reference clock 1320. Upon reaching a count of 10, gate 1342 decodes this count and generates a logic level 0 signal on lead 1342a. Gate 1344 passes this signal on as a logic level 1 clock signal to D-type flip-flop 1351. Since its D input is tied to 5 volts, it clocks a logic level 1 signal to its Q output when this clock pulse appears. This logic level 1 signal appears at the clock input of D-type flip-flop 1352 whose D input is also tied to plus 5 volts. Therefore the flip-flop generates a logic level 1 ready bus failure signal on lead 1352a.

Two flip-flops, 1351 and 1352, are used since it is desirable that the monitor circuit be cleared and capable of detecting further failures upon detection of a first failure. However it is also desirable that the ready bus failure signal remain stable until the problem is corrected. Therefore, flip-flop 1351 and preceeding circuitry can be cleared upon detection of a stuck-at-1 or stuck-at-0 ready signal. However flip-flop 1352 remains set and continues to apply a ready bus failure signal to lead 1352a until the problem is corrected and the processing unit applies a clear failure signal to lead 1352b.

Since ten of these reference clock pulses must be counted before timing out and setting the ready bus failure signal the relevant time-out periods are 0.2, 1, 5 and 10 milliseconds. Thus the appropriate straps would be applied to select a time-out period slightly longer than the expected time required for a ready signal to appear at the input to gate 1306. Should a ready signal so appear flip-flop 1330 toggles since its J and K inputs are normally at a logic level 1. This results in a logic level 0 signal appearing at the $\overline{Q}$ output of flip-flop 1330. This signal causes gate 1332 to apply a logic level 1 signal to 4-bit counter 1341 thereby clearing it and preventing it from counting and timing out. Simultaneously the logic level 0 $\overline{Q}$ output signal of flip-flop 1330 removes the clear signal from 4-bit counter 1340 thereby allowing it to count the clock pulses from reference clock 1320.

Counter 1340 and decoder 1342 operate in the same manner as counter 1341 and decoder 1343. The only difference is that counter 1340 is cleared by a logic level 1 signal on the $\overline{Q}$ output of flip-flop 1330 and counter 1341 is cleared by logic level 0 signal on the $\overline{Q}$ output of flip-flop 1330. Thus the flip-flop that is not cleared is free to count clock pulses from the reference clock source and generate a ready bus failure signal in response to a decode of ten. However this ready bus failure signal is only generated if the processor ready (PRDY) signal does not appear within the predetermined allowable time.

If the system is operating properly, the processor ready signal appears before the decode of 10 is reached and flip-flop 1330 toggles thereby placing a clear signal on the counter, 1340 or 1341, which was running and preventing generation of the ready bus failure signal.

This arrangement allows for detection of a ready signal which is either stuck at 0 or stuck at 1. For example if the processor ready signal is stuck at 0 and flip-flop 1330 is initially reset counter 1340 will be cleared but counter 1341 will be free to count. This counter will then time-out and cause a ready bus failure (RBFAIL) signal since flip-flop 1330 will only toggle upon appearance of a negative going processor ready signal which will not appear when this signal is stuck at 0.

Similarly, if the processor ready signal is stuck at 1 and flip-flop 1330 is set, a logic level 0 signal will appear at the $\overline{Q}$ output. This will cause a logic level 1 signal to appear at the clear input of flip-flop 1341 via gate 1332 thereby causing counter 1341 to clear and allowing counter 1340 to count. Counter 1340 will then time-out upon detection of ten of the reference clock pulses and cause the ready bus failure signal to be generated. Again, this failure signal will be generated since a negative going processor ready signal is required to toggle flip-flop 1330 to clear counter 1340 and prevent generation of the ready bus failure signal.

The processing unit can also routine this circuit by applying a logic level 0 ready-stuck-at-0 (RSA0) or ready-stuck-at-1 (RSA1) signal to the J or K input, respectively, of flip-flop 1330. These signals will force the corresponding logic level 1 or 0 signals on the $\overline{Q}$ output of flip-flop 1330. Under these conditions flip-flop 1330 cannot toggle to generate a clear signal to the counters so they will time out. For example, if a logic level 0 signal is applied to the J input of flip-flop 1330 it will be held in a reset state with a logic level 1 on its $\overline{Q}$ output thereby holding counter 1340 cleared out allowing counter 1341 to count. In such a situation counter 1341 will time out and generate the ready bus failure signal since flip-flop 1330 is prevented from toggling and therefore can't generate a clear signal before the ready bus failure signal is generated.

Similarly, if a logic level 0 signal is applied to the K input of flip-flop 1330 a logic level 0 signal will appear at its $\overline{Q}$ output thereby holding counter 1341 cleared but allowing counter 1340 to count and time out. Again counter 1340 will time out since flip-flop 1330 is held in the set state and is prevented from generating a clear signal before the ready bus failure signal is generated. Thus the processing unit has the capability to routining both ranks of counters and the associated circuitry used to generate the ready bus failure signal.

Gate 1344 generates a logic level 1 signal when either counter 1340 or 1341 times out. Under such conditions gate 1344 generates a logic level 1 clock signal which causes D-type flip-flop 1351 to apply a logic level 1 signal to its Q output. Gate 1345 generates a logic level 1 signal in response to this output signal and the absence of routining signals RSA0 and RSA1. This signal is clocked into D-type flip-flop 1353 when an internal clock pulse (ICLK) appears from the processing unit. The $\overline{Q}$ output of this flip-flop than has a logic level 1 signal which appears at the input to gate 1355. Since initially gate 1354 is reset, a logic level 1 signal appears at its Q output and thus gate 1355 generates a logic level 0 ready timer (−RTMR) signal which clears the monitor circuit via gate 1331. This gate also generates what appears to be a ready signal to gate 1306 to exit the processor from the "WAIT" state and allow further monitoring to continue in the event that the −RDY signal had been stuck-at-1 (not ready condition). On the second clock pulse after the appearance of a logic level 1 signal at the D input of D-type flip-flop 1353, D-type flip-flop 1354 clocks the logic level 1 Q-output of flip-flop 1353 into D-type flip-flop 1354 thereby generating a logic level 0 signal on its $\overline{Q}$ output. This logic level 0 signal causes gate 1355 to remove the ready timer (−RTMR) signal thus presenting a ready timer pulse signal, one clock pulse wide, to gates 1331 and 1306.

Thus, the monitor circuit continues to generate a ready bus failure signal upon its first detection of absence of a ready pulse within the alotted timer period even though the timer circuitry is reset after generation of the ready bus failure (RBFAIL) signal. Upon removal of the condition causing the failure of a ready signal, the processing unit applies a clear signal to lead 1352b of flip-flop 1352 thereby removing the ready bus failure (RBFAIL) from signal the external system.

The processing unit can also clear both ranks of flip-flops via a logic level 0 signal on lead 1331a. Gate 1331 then applies a logic level 0 signal gate 1332 which applies the logic level 1 clear signal to counter 1341. Gate 1331 also applies a logic level 0 clear signal to flip-flop 1330 which then applies the logic level 1 clear signal to counter 1340. This circuit can also be cleared by the external system by applying a logic level 0 fail safe inhibit (FSIHB) signal on lead 1331b. This signal would typically be used during maintenance procedures when the system is not arranged to provide the required ready signals.

It will be obvious to those skilled in the art that numerous modifications of the present invention can be made without departing from the spirit of the invention which shall be limited only by the scope of the claims appended hereto.

What is claimed is:

1. A pulse monitor circuit for use in a switching system, said pulse monitor circuit comprising:
   a first source of pulses;
   a second source of pulses;
   input storage means connected to said first pulse source operated in response to each of a first group of alternately occurring pulses to generate a first clear signal, said input storage means further operated in response to each of a second group of alternately occurring pulses from said first pulse source to generate a second clear signal;
   a first counter circuit connected to said input storage means and said second pulse source, operated in response to an absence of said first clear signal to count pulses from said second pulse source;
   a second counter circuit connected to said input storage means and said second pulse source, operated in response to an absence of said second clear signal to count pulses from said second pulse source;
   output storage means connected to said first and second counter circuits, operated in response to a predetermined count from said first or second counter circuits to generate a pulse failure signal; and
   third pulsing means connected to said output storage means, operated in response to said pulse failure signal to generate a toggle pulse; said output storage means further operated in response to said toggle pulse to prevent generation of said pulse failure signal.

2. A pulse monitor circuit as claimed in claim 1, wherein: said first counter circuit is further operated in response to said first clear signal to prevent counting of pulses from said second pulse source and said second counter circuit is further operated in response to said second clear signal to prevent counting of pulses from said second pulse source.

3. A pulse monitor circuit as claimed in claim 1, wherein: said input storage means comprise a flip-flop.

4. A pulse monitor circuit as claimed in claim 3, wherein there is further included: a logic level 0 signal source, said flip-flop comprising a J-K flip-flop having first and second inputs connected to said logic level 0 signal source, said J-K flip-flop operated in response to a logic level 0 signal on its first input to generate said first clear signal, said J-K flip-flop further operated in response to a logic level 0 signal on its second input to generate said second clear signal.

5. A pulse monitor circuit as claimed in claim 1, wherein there is further included: gating means having first and second inputs, said first input connected to said input storage means, and said second input connectable to ground, said gating means operated in response to said clear signal from said input storage means, a ground signal to apply a clear signal to a connected counter circuit.

6. A pulse monitor circuit as claimed in claim 5, wherein: said gating means further includes a third input connected to said third pulsing means, said gating means further operated in response to said toggle pulse or said ground signal to reset said input storage means, said gating means further operated in response to said toggle pulse or said grounds signal to apply a clear signal to said connected counter circuit.

7. A pulse monitor circuit as claimed in claim 1, wherein: said output storage means comprise a decoder connected to said first and second counter circuits and a flip-flop connected to said decoder, said decoder operated in response to said first or second predetermined count to generate a trigger signal; said flip-flop operated in response to said trigger signal to generate said pulse failure signal.

8. A pulse monitor circuit as claimed in claim 7, wherein said output flip-flop comprises a first D-type flip-flop having its D input connected to a bias supply and its clock input connected to said decoder.

9. A pulse monitor circuit as claimed in claim 8, wherein there is further included: a second D-type flip-flop, having its clock input connected to said first D-type, flip-flop and its D input connected to said bias supply, said pulse monitor further comprising gating means, connected to said third pulsing means, said input storage means, and connectable to ground, said gating means operated in response to said toggle pulse, said clear signal or said ground signal to generate a reset signal; said first D-type flip-flop connected to said gating means operated in response to said reset signal to inhibit said pulse failure signal; said second D-type flip-flop operated in response to said pulse failure signal to generate a stored pulse failure signal.

10. A pulse monitor circuit as claimed in claim 1, wherein: said first and second counter circuits each comprise a four-bit counter.

11. A pulse monitor circuit as claimed in claim 1, wherein there is further included a clock pulse source, said third pulse source comprising first toggle signal storage means, operated in response to said pulse failure signal and a clock pulse to generate a first stored toggle signal;

second toggle signal storage means connected to said first toggle signal storage means, operated in response to said first stored toggle signal and a clock pulse to generate a second stored toggle signal; and second gating means connected to said first and second toggle signal storage means operated in response to said first and second storage toggle signals to generate said toggle pulse.

12. A pulse monitor circuit as claimed in claim 1, wherein there is further included a routining signal source, said third pulse source further operated in response to said routining signal to inhibit said toggle pulse.

13. A pulse monitor circuit as claimed in claim 1, wherein there is further included: a first routining signal source, said input storage means further operated in response to said first routining signal to generate said first clear signal.

14. A pulse monitor circuit as claimed in claim 13, wherein there is further included: a second routining signal source, said input storage means further operated in response to said second routining signal to generate said second clear signal.

* * * * *